United States Patent
Olac-Vaw et al.

(10) Patent No.: US 11,562,999 B2
(45) Date of Patent: Jan. 24, 2023

(54) COST EFFECTIVE PRECISION RESISTOR USING BLOCKED DEPOP METHOD IN SELF-ALIGNED GATE ENDCAP (SAGE) ARCHITECTURE

(71) Applicant: Intel Corporation, Santa Clara, CA (US)

(72) Inventors: Roman Olac-Vaw, Hillsboro, OR (US); Nick Lindert, Portland, OR (US); Chia-Hong Jan, Portand, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 970 days.

(21) Appl. No.: 16/147,733

(22) Filed: Sep. 29, 2018

(65) Prior Publication Data
US 2020/0105746 A1  Apr. 2, 2020

(51) Int. Cl.
| | |
|---|---|
| *H01L 27/06* | (2006.01) |
| *H01L 27/07* | (2006.01) |
| *H01L 49/02* | (2006.01) |
| *H01L 29/51* | (2006.01) |
| *H01L 29/78* | (2006.01) |
| *H01L 21/027* | (2006.01) |
| *H01L 29/66* | (2006.01) |
| *H01L 23/522* | (2006.01) |
| *H01L 23/00* | (2006.01) |

(52) U.S. Cl.
CPC ...... *H01L 27/0738* (2013.01); *H01L 21/0274* (2013.01); *H01L 28/20* (2013.01); *H01L 29/517* (2013.01); *H01L 29/66545* (2013.01); *H01L 29/7851* (2013.01); *H01L 23/5226* (2013.01); *H01L 24/17* (2013.01)

(58) Field of Classification Search
CPC .................................................. H01L 27/0629
See application file for complete search history.

(56) References Cited

U.S. PATENT DOCUMENTS

| | | | |
|---|---|---|---|
| 2002/0084886 A1* | 7/2002 | Wu | H01L 21/84 338/307 |
| 2005/0227440 A1* | 10/2005 | Ema | H01L 27/0629 257/E21.639 |

(Continued)

FOREIGN PATENT DOCUMENTS

| | | | | |
|---|---|---|---|---|
| WO | WO-2018063259 A1 * | 4/2018 | ..... | H01L 21/823431 |
| WO | WO-2018182736 A1 * | 10/2018 | ..... | H01L 21/823431 |

*Primary Examiner* — Christopher A Johnson
(74) *Attorney, Agent, or Firm* — Schwabe, Williamson & Wyatt, P.C.

(57) ABSTRACT

A method for fabricating a semiconductor structure includes forming a plurality of semiconductor fins protruding through a trench isolation region above a substrate. A first gate structure is formed over a first of the plurality of semiconductor fins. A second gate structure is formed over a second of the plurality of semiconductor fins. A gate edge isolation structure is formed laterally between and in contact with the first gate structure and the second gate structure, the gate edge isolation structure on the trench isolation region and extending above an uppermost surface of the first gate structure and the second gate structure. A precision resistor is formed on the gate edge isolation structure, wherein the precision resistor and the first gate structure and second gate structure comprise a same material layer.

11 Claims, 9 Drawing Sheets

(56) References Cited

U.S. PATENT DOCUMENTS

| | | | |
|---|---|---|---|
| 2016/0233298 A1* | 8/2016 | Webb | H01L 29/785 |
| 2017/0162646 A1* | 6/2017 | Lee | H01L 27/0629 |
| 2020/0066712 A1* | 2/2020 | Hafez | H01L 27/1211 |

* cited by examiner

COST EFFECTIVE PRECISION RESISTOR USING BLOCKED DEPOP METHOD IN SELF-ALIGNED GATE ENDCAP (SAGE) ARCHITECTURE

TECHNICAL FIELD

Embodiments of the disclosure are in the field of integrated circuit structures and, in particular, a cost effective precision resistor using a blocked DEPOP method in a self-aligned gate endcap (SAGE) architecture.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
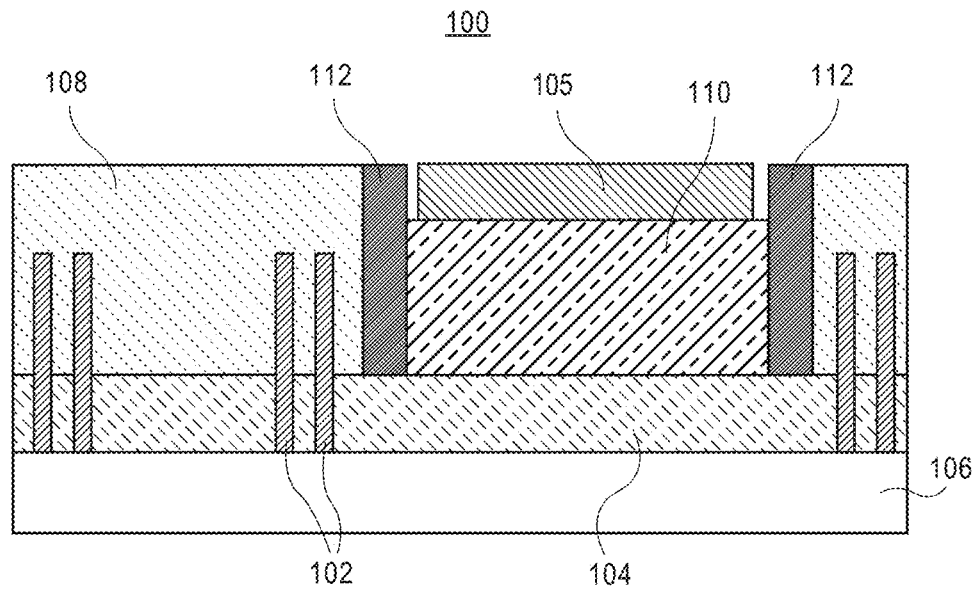
FIG. 1 is a diagram illustrating a conventional precision resistor semiconductor structure.

A cost effective precision resistor using a blocked DEPOP method in a self-aligned gate endcap (SAGE) architecture are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to the fabrication of a cost effective precision resistor using a blocked DEPOP method in a self-aligned gate endcap (SAGE) architecture. In an embodiment, such precision resistors are implemented as a fundamental component of a system-on-chip (SoC) technology, due to the high speed I/Os required for faster data transfer rates. Such resistors may enable the realization of high speed analog circuitry (such as CSI/SERDES) and scaled I/O architectures due to the characteristics of having low variation and near-zero temperature coefficients.

To provide context, traditional resistors used in current process technologies typically fall in one of two classes: general resistors or precision resistors. General resistors, such as trench contact resistors, are cost-neutral but may suffer from high variation due to variations inherent in the fabrication methods utilized or the associated large temperature coefficients of the resistors, or both. Precision resistors may alleviate the variation and temperature coefficient issues, but often at the expense of higher process cost and an increased number of fabrication operations required. The integration of polysilicon precision resistors is proving increasingly difficult in high-k/metal gate process technologies.

FIG. 1 is a diagram illustrating a conventional precision resistor semiconductor structure. The semiconductor structure 100 includes a plurality of semiconductor fins 102 protruding through a trench isolation regions 104 above a substrate 106. A polysilicon gate structure 108 is shown over two pair of semiconductor fins 102 over the trench isolation regions 104. A polysilicon cut etch 112 is between the doped polysilicon resistor 110 and the polysilicon gate 108. A conventional doped polysilicon resistor 110 is typically located in an area devoid of semiconductor fins 102. The polysilicon resistor 110 is patterned using the same materials as polysilicon gate 108 and is then recessed down to make room for an anode/cathode 105 that is formed on top of the polysilicon resistor 110.

Such a solution has several disadvantages. One disadvantages that the solution relies upon using patterning to form the polysilicon resistor 110, which is not cost effective. Also, the doped polysilicon resistor 110 is covered with oxide so that it is not etched out through the down-stream process steps. Another disadvantage is that a polysilicon cut etch 112 is required between the doped polysilicon resistor 110 and polysilicon gate 108, which can result process variation.

Figure 2:
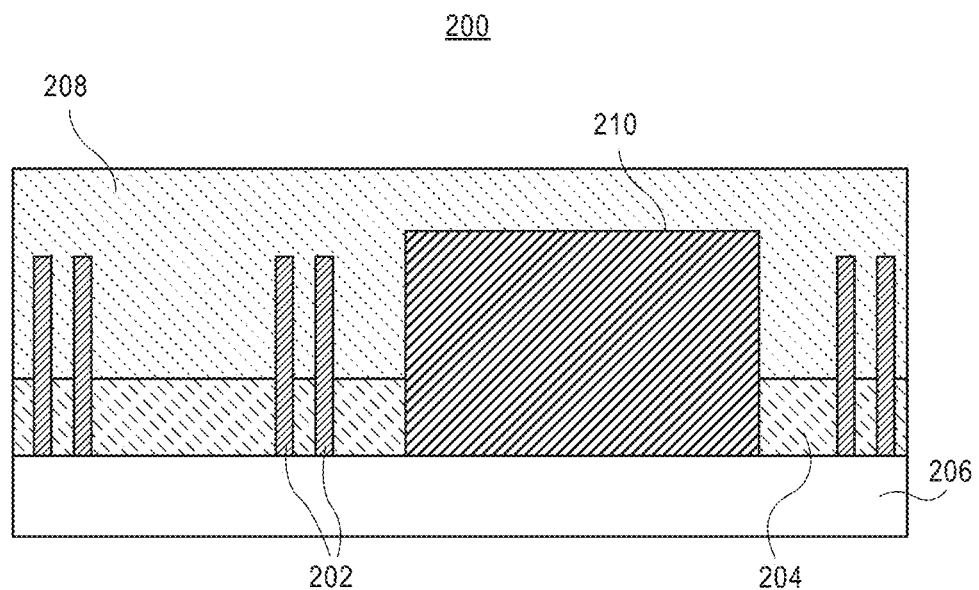
FIG. 2 is a illustrating a self-aligned gate endcap (SAGE) semiconductor structure.

FIG. 2 is a illustrating a self-aligned gate endcap (SAGE) semiconductor structure. Semiconductor structure 200 includes a plurality of semiconductor fins 202 protruding through a trench isolation regions 204 above a substrate 206. A dummy or permanent polysilicon gate structure 208 is shown over pairs of semiconductor fins 202 over the trench isolation regions 204. The SAGE processing scheme involves the formation of isolation structures 210 called gate/trench contact endcaps, which are self-aligned to semiconductor fins 202 without requiring an extra length to account for mask mis-registration. The process for forming the polysilicon resistor 110 shown in FIG. 1 is not compatible for high scaling SAGE architecture such as shown in FIG. 2 because the isolation structures 210 are also located between the fin regions on the trench isolation 204, thus occupying the location traditionally occupied by the doped polysilicon resistor 110.

In accordance with one or more embodiments of the present invention, an integrated precision resistor is fabricated within a highly-scaled SAGE transistor architecture. It is to be appreciated that traditional resistors used in high-k/metal gate process technologies are typically tungsten trench contacts (TCN), well resistors, recessed and covered precision resistors as shown in FIG. 1, or metal thin-film resistors (TFR). Such resistors either add process cost or complexity, or suffer from high variation and poor temperature coefficients due to variations in the fabrication processes used.

Figure 3A:
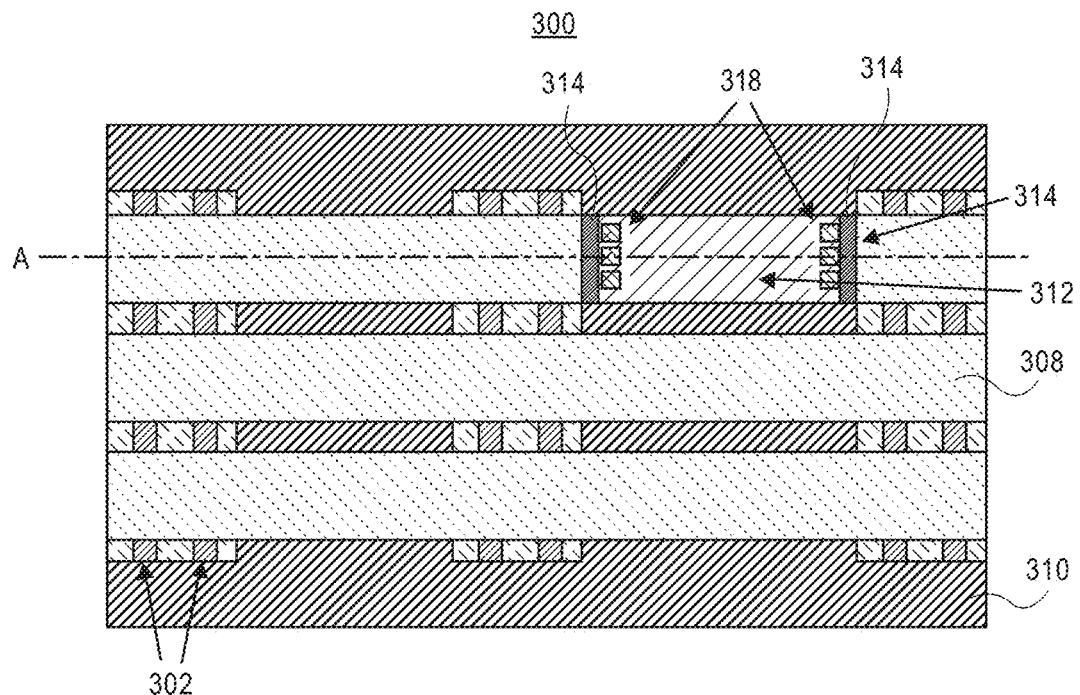
FIG. 3A illustrates a plan view of a layout including fin-based semiconductor devices.
Figure 3B:
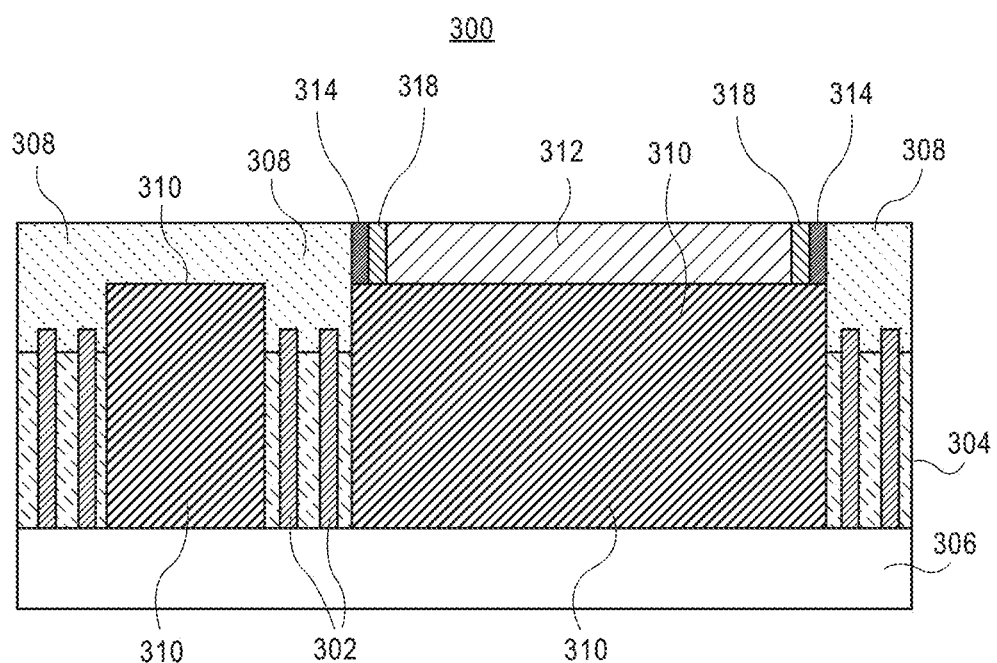
FIG. 3B is a cross-section diagram of the layout of FIG. 3A showing a precision resistor integrated into a SAGE architecture in accordance with the disclosed embodiments.

FIG. 3A illustrates a plan view of a layout including fin-based semiconductor devices, and FIG. 3B is a cross-section diagram of the layout of FIG. 3A showing a precision resistor integrated into a SAGE architecture in accordance with the disclosed embodiments. Referring to both FIGS. 3A and 3B, the layout 300 shows fin-based semiconductor devices based on a plurality of semiconductor fins 302 protruding through a trench isolation regions 304 above a substrate 306. A gate structure 308, which may include a gate electrode and gate dielectric layer (not shown), is generally orthogonal to the semiconductor fins 302 and lies over tops of a grouping of one or more of the semiconductor fins 302. For example, FIGS. 3A and 3B shows three gate structures 308, each formed over pairs of semiconductor fins 302. In one embodiment, the gate structure 308 comprises dummy or permanent polysilicon gates. Dummy gates may be replaced with permanent gate during formation of layout 300, as described further below.

Self-aligned gate edge (SAGE) isolation structures 310 (or gate/trench contact endcaps) are laterally between and in contact with adjacent gate structures 308. The gate edge isolation structures 310 are located in non-fin regions of the layout 300 on the trench isolation region 304 and extend above an uppermost surface of the gate structures 308 after the dummy gate is replaced with permanent gate structures. The gate edge isolation structure 310 are also self-aligned to semiconductor fins 302.

According to the disclosed embodiments, instead of placing a precision resistor under the gate edge isolation structure 310, the precision resistor 312 of the disclosed embodiments is formed on top of the gate edge isolation structure 310. In an embodiment, the precision resistor 312 is formed from the same material layer used to form dummy gate structures that are replaced during fabrication with metal gate structures 308. Thus, in one embodiment, the precision resistor 312 is a continuous layer of polysilicon that is self-aligned with polysilicon gate patterning and is formed within boundaries of the gate edge isolation structure 310, as shown in FIG. 3B. The precision resistor 312 is isolated from the gate structures 308 by a pair of dielectric plugs 314 (e.g., local interconnect gate (LIG) plugs) in local interconnect regions. An anode/cathode pair 318 are electrically coupled to the precision resistor and may be formed adjacent to the dielectric plugs 314.

As also shown in FIG. 3B, the precision resistor 312 is also uncovered, except for an interlayer dielectric (ILD) (not shown) formed over the layout 300. In one embodiment, the precision resistor 312 may have a thickness of approximately 50-200 microns. In one example embodiment, the width of the precision resistor 312 itself is approximately 100-900 microns. Although a total width of the precision resistor 312, the pair of dielectric plugs 314 and the anode/cathode pair 318 is shown being substantially the same width as the gate edge isolation structure 310, in another embodiment, the total width may be less that the gate edge isolation structure 310. In one embodiment, the precision resistor 312 may be implanted. But because the precision resistor is not buried beneath the gate edge isolation structures 310, a lower energy implant may be performed. For example, in one embodiment, the precision resister may be implanted with boron to a level of 3-10 KeV or implanted with arsenic at a higher energy level of 10-40 KeV.

The disclosed embodiments avoids the variation in the polysilicon cut etch 112 between doped polysilicon resistor 110 and the polysilicon gate 108, as shown in FIG. 1, which enables a defect free process with low variation. The disclosed embodiments also eliminate the requirement that the polysilicon resistor be recessed and covered with oxide to protect the polysilicon resistor from down-stream process, instead the polysilicon resistor is protected only with a hardmask during fabrication, which is subsequently removed.

In accordance with a further aspect of the disclosed embodiments, the precision resistor is fabricated using a blocked Dry Etch Poly Open Polish (DEPOP) method.

In general, the disclosed embodiments describe a method for fabricating a semiconductor structure as follows. A plurality of semiconductor fins are formed that protrude through a trench isolation region above a substrate. A first gate structure is formed over a first of the plurality of semiconductor fins. A second gate structure is formed over a second of the plurality of semiconductor fins. A gate edge isolation structure is formed laterally between and in contact with the first gate structure and the second gate structure, the gate edge isolation structure on the trench isolation region and extending above an uppermost surface of the first gate structure and the second gate structure. A precision resistor is formed on the gate edge isolation structure, wherein the precision resistor and the first gate structure and second gate structure comprise a same material layer.

FIGS. 4A-4F illustrate cross-sectional views showing a method for fabricating self-aligned gate edge (SAGE)-integrated precision resistor in accordance with one embodiment of the present disclosure, where like components from FIGS. 3A and 3B have like reference numerals.

Figure 4A:
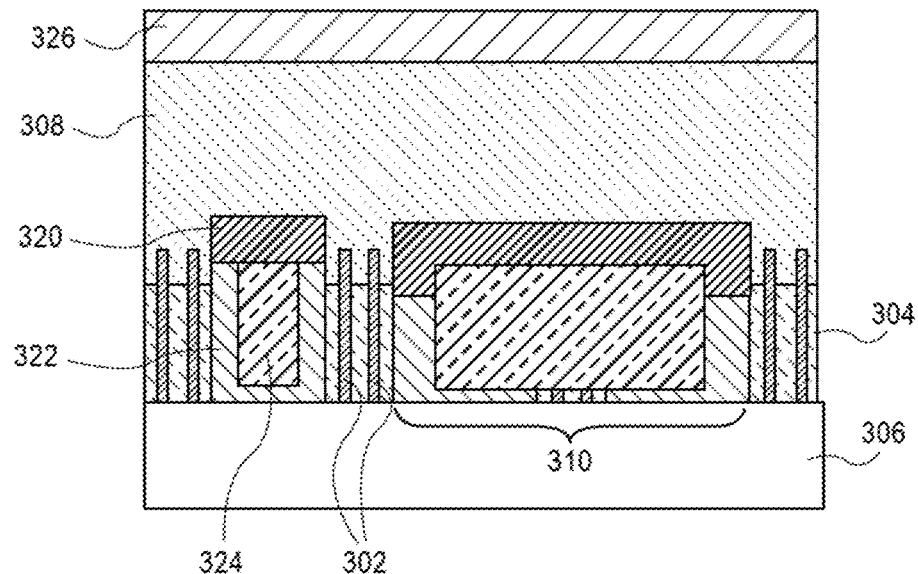
FIGS. 4A-4F illustrate cross-sectional views showing a method for fabricating self-aligned gate endcap (SAGE)-integrated precision resistor in accordance with one embodiment of the present disclosure.

FIG. 4A illustrates the fabrication process after a conventional FinFET flow through fin patterning and shallow trench isolation (STI) recess that form trench isolation region 304 and semiconductor fins 302. Thereafter, the gate edge isolation structures 310 are formed in the trench isolation region 304 in non-fin regions. In one embodiment, a top portion 320 of the gate edge isolation structures 310 may comprise hafnium oxide, sides and bottom portion 322 may comprise silicon nitride, and an inner portion 324 may comprise silicon oxide. In one embodiment, the top portion 320 may have a width of approximately 10-20 nm, the sides and bottom portion 322 may have widths of approximately 10-50 nm, width and the inner portion 324 filling an interior of the gate edge isolation structure 310. In one embodiment, the dummy gate structure 308 is formed by conformably depositing a layer of polysilicon over trench isolation region 304, including the semiconductor fins 302 and the gate edge isolation structures 310, and polishing the layer of polysilicon. A hardmask layer 326 is formed over the dummy gate structure 308. In one embodiment, the hardmask layer 326 may comprise silicon nitride.

Figure 4B:
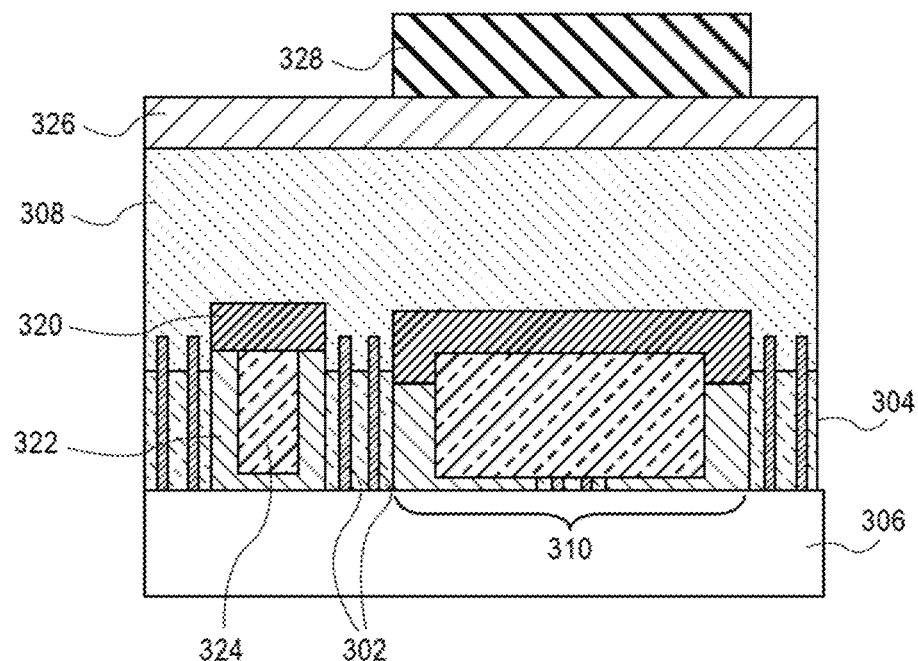

FIG. 4B illustrates the fabrication process after a photoresist layer 328 is patterned over the hardmask layer 326 through lithography and etching to define a resistor location (s) over one or more of the gate edge isolation structures 310.

Figure 4C:
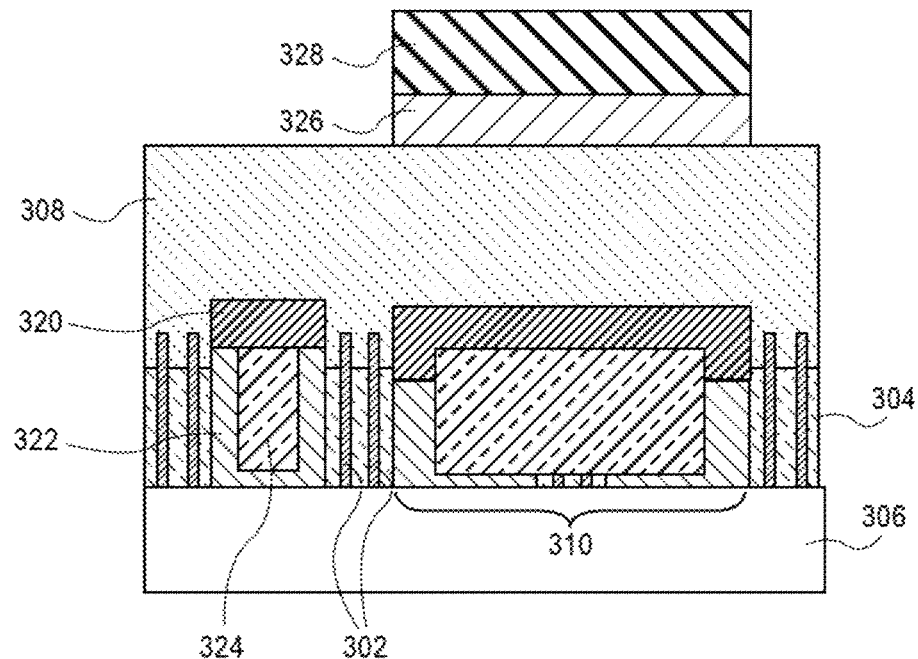

FIG. 4C illustrates the fabrication process after a block dry etch poly open (DEPOP) process is used to remove the hardmask layer 326 left uncovered by the photoresist layer 328, i.e., from the dummy gate structure 308 except for the defined resistor location(s) over the one or more of the gate edge isolation structures 310.

Figure 4D:
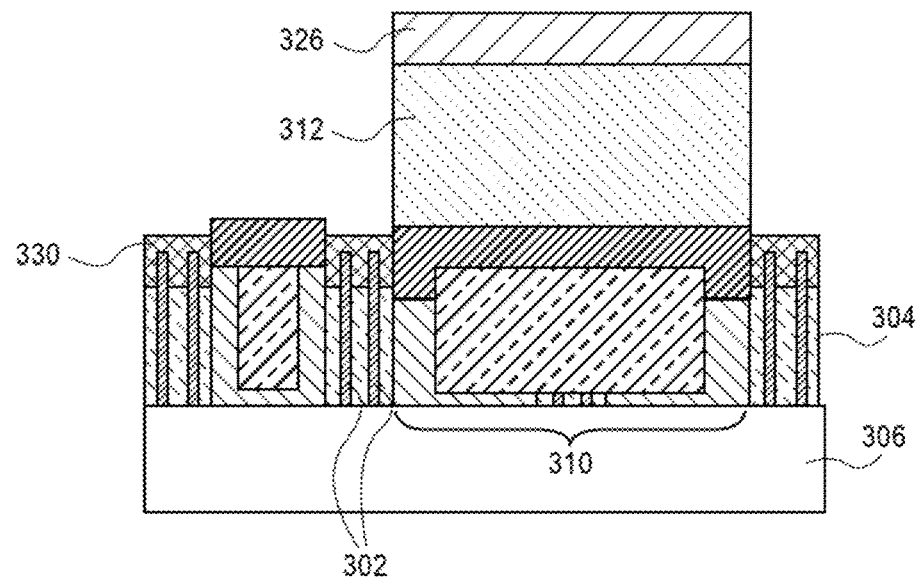

FIG. 4D illustrates the fabrication process after the block DEPOP process is used to remove the dummy gate structure 308 left uncovered by the hardmask layer 326. The block DEPOP preserves the section of the dummy gate structure 308 under the hardmask layer 326 from being removed so that the section of the dummy gate structure 308 can be used as a precision resistor. In a conventional process, all the hardmask layer 326 and all the dummy gate structure 308 would be removed. In accordance with the disclosed embodiments, however, the photoresist layer 328 is added over the hardmask layer 326 in the defined resistor location such that the precision resistor 312 is formed on top of the gate edge isolation structure 310 after removal of the dummy gate structure 308. In addition, because the precision resistor 312 is formed directly from the dummy gate structure 308, the precision resistor 312 is self-aligned to the dummy gate structure 308. In areas where the dummy gate structure 308 is removed, a regular metal gate process is used to replace the dummy gate structure 308 with metal gate electrodes 330. The example in FIG. 4D shows three gate electrodes 330 formed over three separate pairs of semiconductor fins 302.

In one embodiment, the gate electrodes 330 may be fabricated by a replacement gate process. In such a scheme, the dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gate structure 308 is removed by a dry etch or wet etch process. In one embodiment, dummy gate structure 308 is composed of polycrystalline silicon or amorphous silicon and are removed with a dry etch process including use of SFe. In another embodiment, dummy gate structure 308 is composed of polycrystalline silicon or amorphous silicon and are removed with a wet etch process including use of aqueous NI 40H or tetramethylammonium hydroxide. In one embodiment, dummy gate structure 308 is composed of silicon nitride and are removed with a wet etch including aqueous phosphoric acid.

Figure 4E:
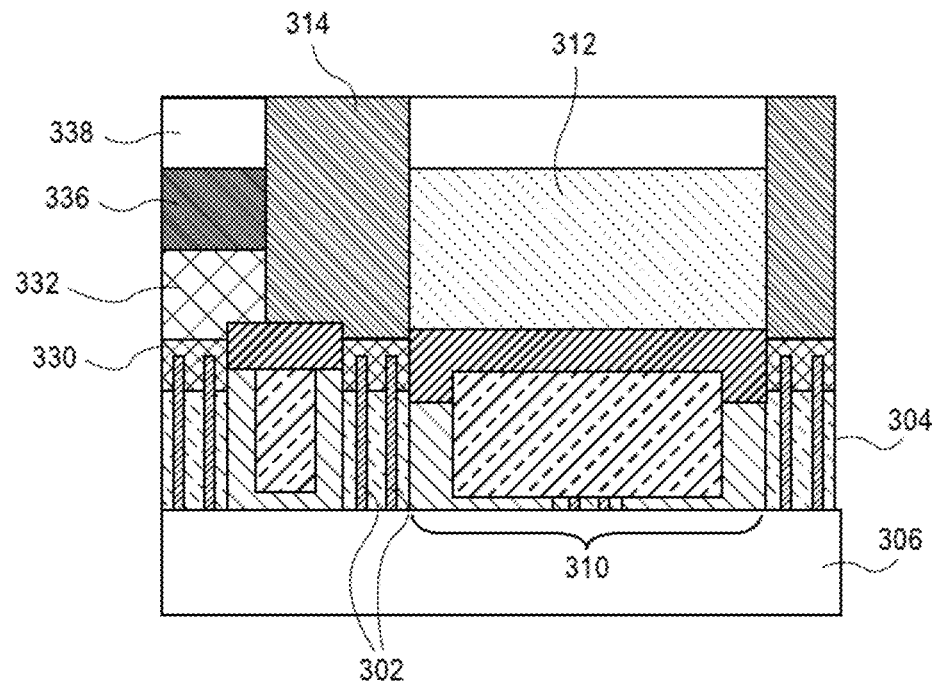

FIG. 4E illustrates the fabrication process after the hardmask layer 326 is removed and a local interconnect gate process is used to isolate the precision resistor 312 from active gate electrodes 330 by forming metal local interconnects 332 over the gate electrodes that require a connection, and by forming dielectric plugs 314 in contact with the gate electrodes 330 on opposite sides of the precision resistor 312. In a SAGE architecture, local interconnects 332 are typically used to connect adjacent transistors by routing metal over the gate edge isolation structure 310, which are isolating the transistors. In one embodiment, the local interconnects 332 comprise the same metal as used for the gate electrodes 330. In an embodiment, the continuity of the local interconnect 332 is interrupted by the dielectric plugs 314 in cases where a break in electrical contact along a gate line are needed. As used, herein, the term "plug" is used to refer to a non-conductive space or interruption of a metal or otherwise conductive structure, such as an interruption of a local interconnect feature. A gate insulation layer 336 may be formed over the local interconnect 332. A top surface of the structure is also covered with a dielectric capping layer 338. In such an embodiment, the dielectric plugs 314 are formed through the dielectric capping layer 338.

Figure 4F:
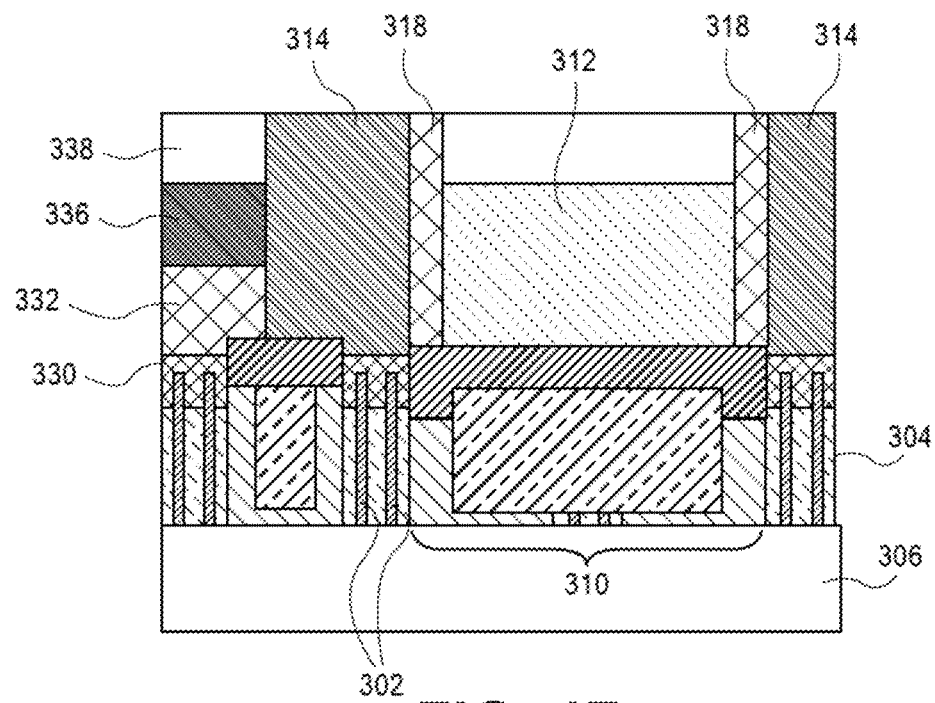

FIG. 4F illustrates the fabrication process after an anode/cathode pair 318 are formed through the dielectric capping layer 338 and electrically coupled to the precision resistor 312 adjacent to the dielectric plugs 314.

In an embodiment, the semiconductor structure or device 300 is a non-planar device such as, but not limited to, a finFET or a tri-gate device. In such an embodiment, a corresponding semiconducting channel region is composed of or is formed in a three-dimensional body. In one such embodiment, the gate electrodes 330 surround at least a top surface and a pair of sidewalls of the three-dimensional body.

Substrate 306 may be composed of a semiconductor material that can withstand a manufacturing process and in which charge can migrate. In an embodiment, substrate 306 is a bulk substrate composed of a crystalline silicon, silicon/germanium or germanium layer doped with a charge carrier, such as but not limited to phosphorus, arsenic, boron or a combination thereof, to form active region. In one embodiment, the concentration of silicon atoms in bulk substrate 802 is greater than 97%. In another embodiment, bulk substrate 306 is composed of an epitaxial layer grown atop a distinct crystalline substrate, e.g. a silicon epitaxial layer grown atop a boron-doped bulk silicon mono-crystalline substrate. Bulk substrate 306 may alternatively be composed of a group III-V material. In an embodiment, bulk substrate 306 is composed of a I.I1-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 306 is composed of a III-V material and the charge-carrier dopant impurity atoms are ones such as, but not limited to, carbon, silicon, germanium, oxygen, sulfur, selenium or tellurium.

Self-aligned gate edge isolation structures 310 may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures may be composed of a gate electrode stack which includes a gate dielectric layer (not shown) and a gate electrode 330. In an embodiment, the gate electrode 330 of the gate electrode stack is composed of a metal gate. In one embodiment, the gate electrode 330 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

The gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 306. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

Local interconnect 332 may be composed of titanium nitride (TiN) or tungsten (W), as described above. It is to be appreciated that other metals may be used in place of, or in combination with, titanium nitride (TiN) or tungsten (W).

Figure 5:
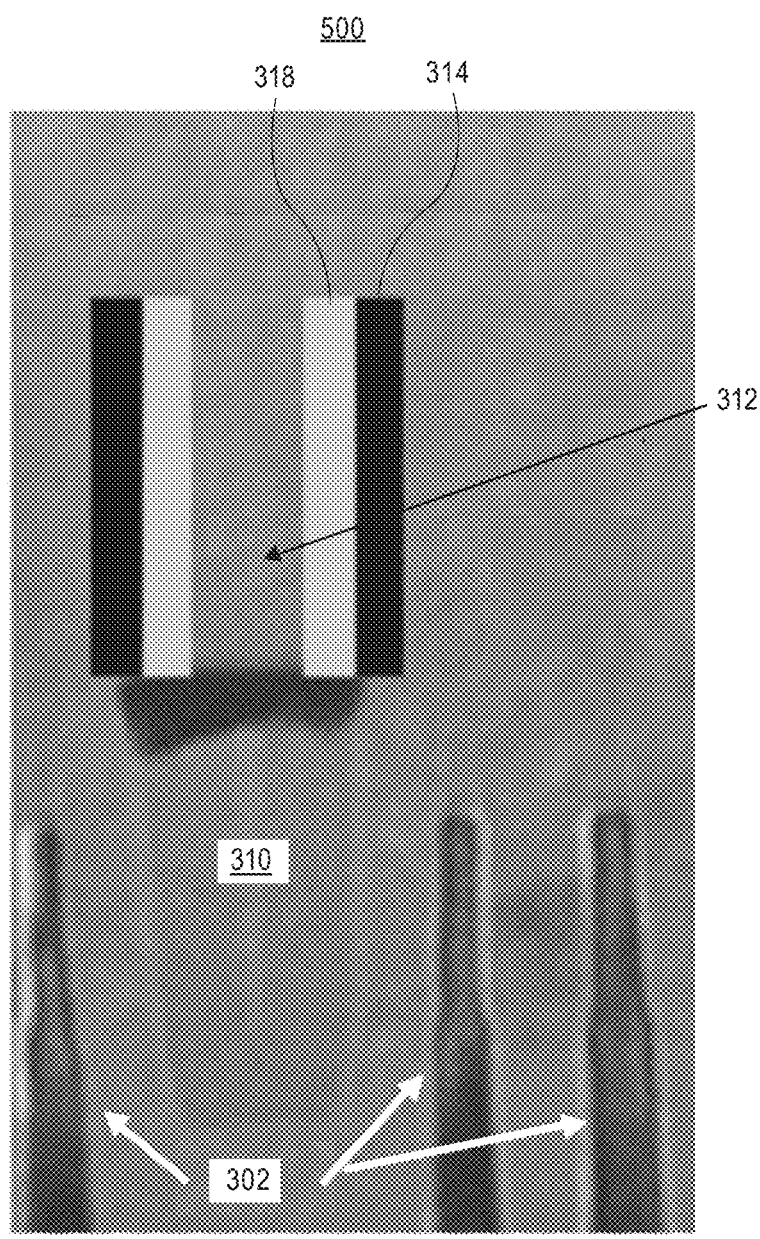
FIG. 5 is a transmission electron microscopy image of a semiconductor structure showing a precision resistor.

FIG. 5 is a transmission electron microscopy image of a semiconductor structure 500 showing a precision resistor. FIG. 5 shows semiconductor fins 302, a self-aligned gate edge isolation structure 310, a polysilicon precision resistor 312 over the gate edge isolation structure 310, and dielectric plugs 314 and anode/cathode pair 318 on opposite sides of the polysilicon precision resistor 312.

The integrated circuit structures described herein may be included in an electronic device. As an example of one such apparatus, FIGS. 6A and 6B are top views of a wafer and dies that include one or more precision resistors in a SAGE architecture, in accordance with one or more of the embodiments disclosed herein.

Figure 6B:
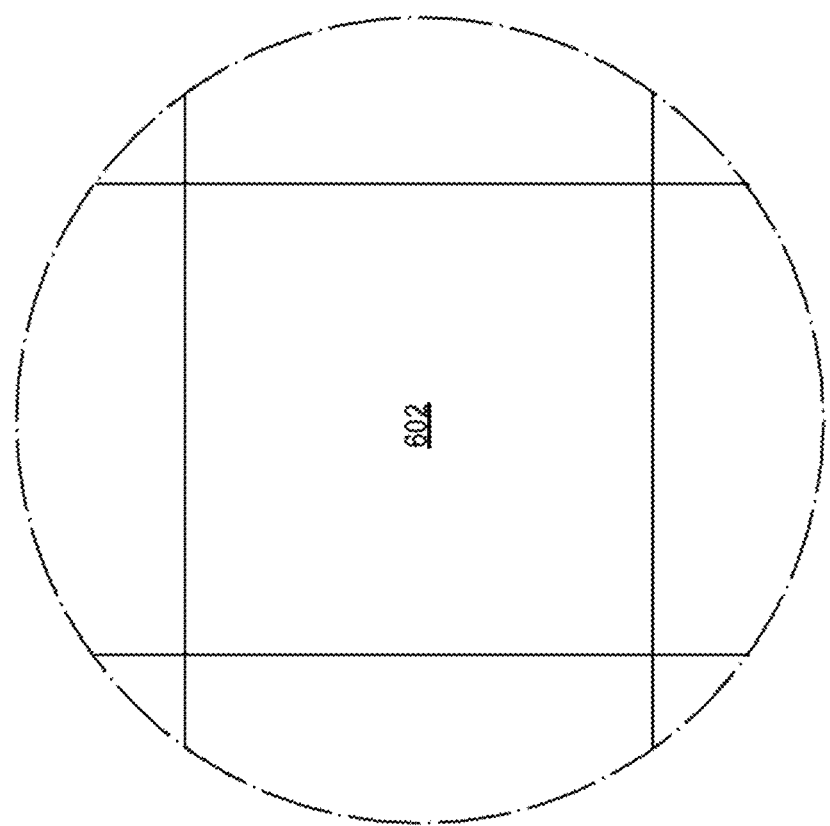
FIGS. 6A and 6B are top views of a wafer and dies that include one or more precision resistors in a SAGE architecture, in accordance with one or more of the embodiments disclosed herein.
Figure 6A:
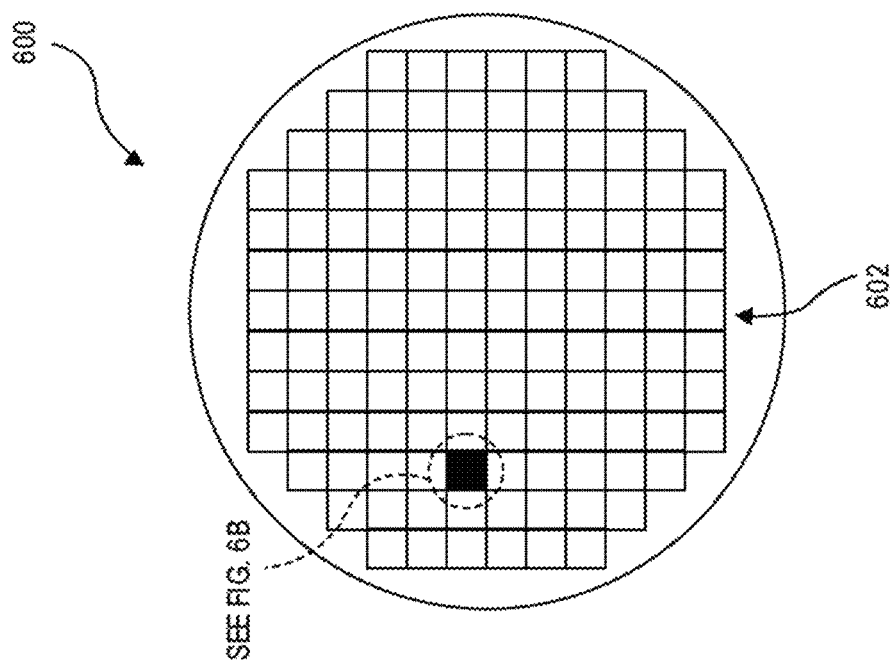

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more precision resistors in a SAGE architecture, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
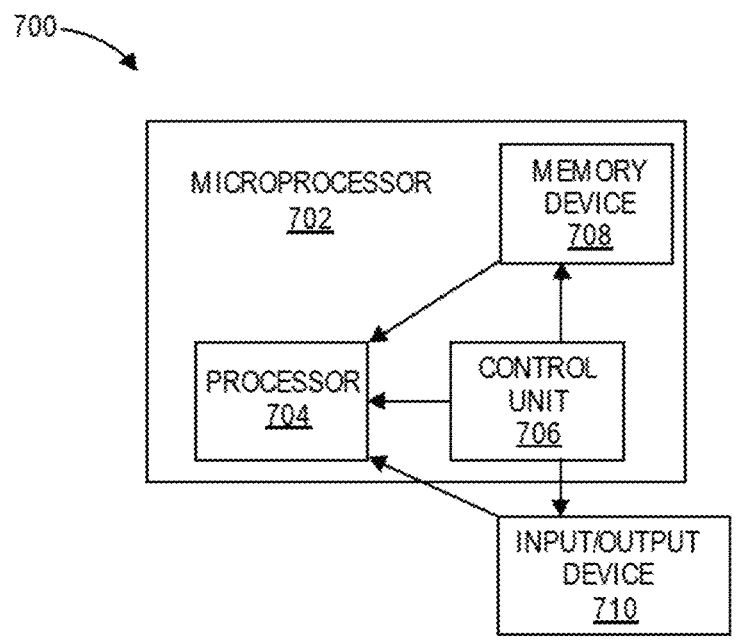
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more precision resistors in a SAGE architecture, such as those described herein.

Figure 8:
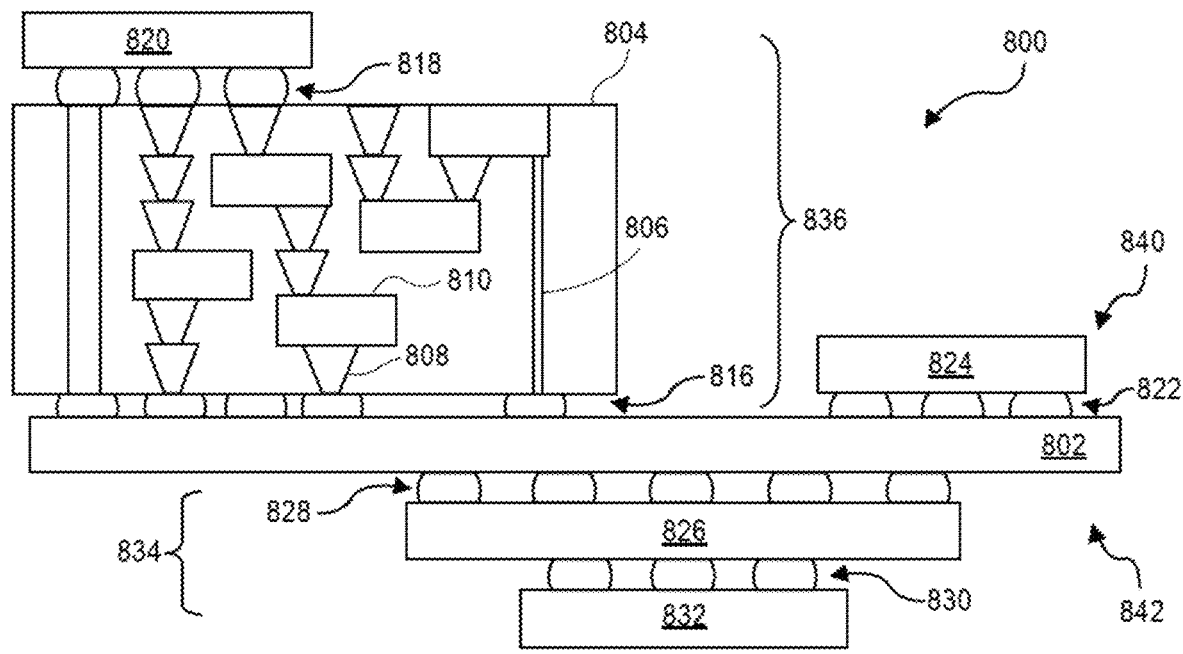
FIG. 8 is a cross-sectional side view of an integrated circuit (IC) device assembly that may include one or more precision resistors in a SAGE architecture, in accordance with one or more of the embodiments disclosed herein.

FIG. 8 is a cross-sectional side view of an integrated circuit (IC) device assembly that may include one or more precision resistors in a SAGE architecture, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of precision resistors in a SAGE architecture, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
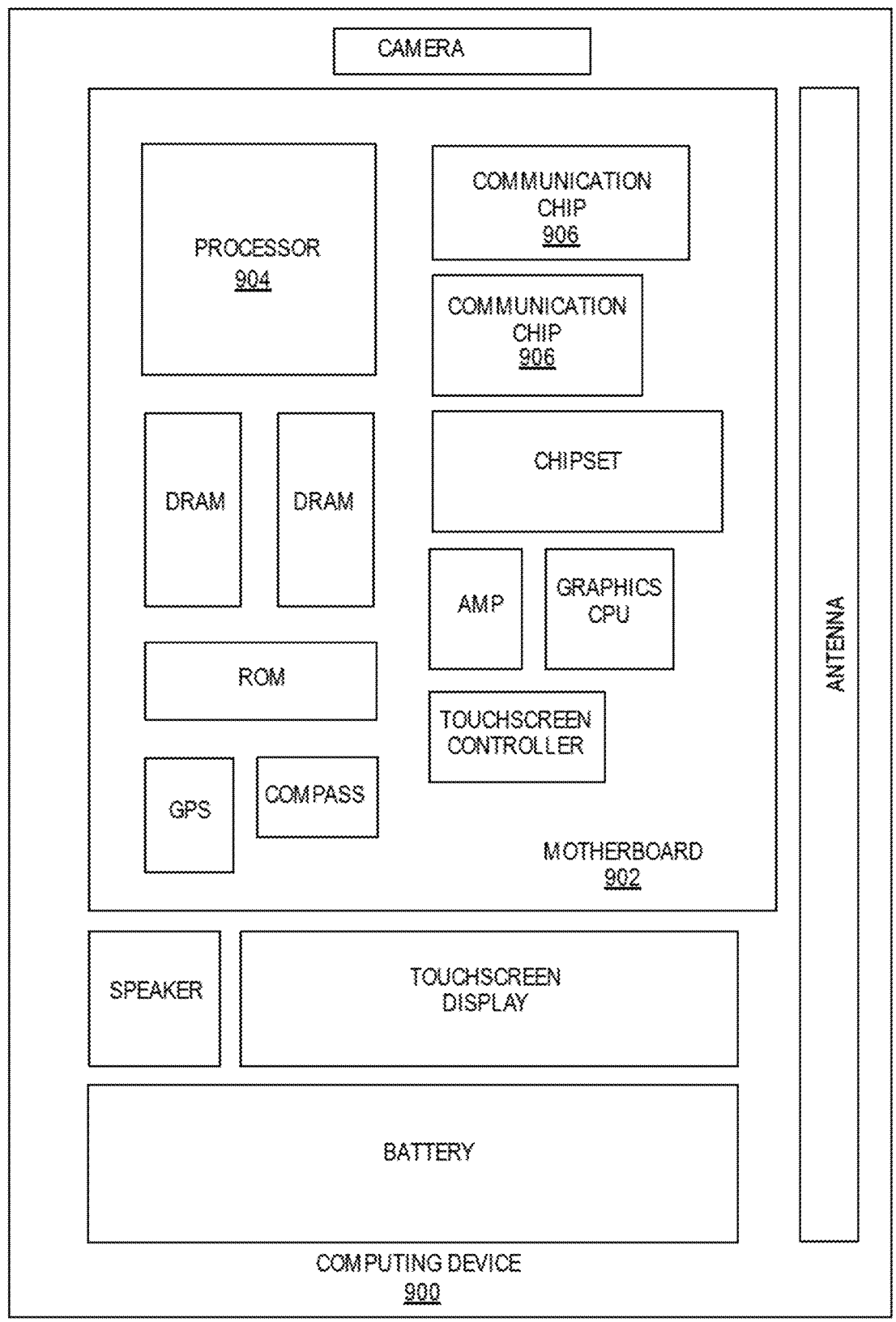
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more precision resistors in a SAGE architecture, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more precision resistors in a SAGE architecture, in accordance with implementations of embodiments of the disclosure.

In further implementations, another component housed within the computing device 900 may contain an integrated circuit die that includes one or more precision resistors in a SAGE architecture, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include precision resistors in a SAGE architecture.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A method for fabricating a semiconductor structure includes forming a plurality of semiconductor fins protruding through a trench isolation region above a substrate. A first gate structure is formed over a first of the plurality of semiconductor fins. A second gate structure is formed over a second of the plurality of semiconductor fins. A gate edge isolation structure is formed laterally between and in contact with the first gate structure and the second gate structure, the gate edge isolation structure on the trench isolation region and extending above an uppermost surface of the first gate structure and the second gate structure. A precision resistor is formed on the gate edge isolation structure, wherein the precision resistor and the first gate structure and second gate structure comprise a same material layer.

Example embodiment 2: The semiconductor structure of example embodiment 1, wherein the precision resistor is uncovered except for a dielectric layer.

Example embodiment 3: The semiconductor structure of example embodiment 1 or 2, wherein the precision resistor comprises polysilicon.

Example embodiment 4: The semiconductor structure of example embodiment 1, 2 or 3 wherein the precision resistor has a thickness of approximately 50-200 microns.

Example embodiment 5: The semiconductor structure of example embodiment 1, 2, 3 or 4, wherein the precision resistor has a width of approximately 100-900 microns.

Example embodiment 6: The semiconductor structure of example embodiment 1, 2, 3, 4 or 5, wherein the precision resistor is implanted with boron at 3-10 KeV or implanted with arsenic at 10-40 KeV.

Example embodiment 7: The semiconductor structure of example embodiment 1, 2, 3, 4, 5 or 6, wherein the gate edge isolation structure comprises hafnium oxide, silicon nitride, and silicon oxide.

Example embodiment 8: The semiconductor structure of example embodiment 1, 2, 3, 4, 5, 6 or 7 wherein the precision resistor on the gate edge isolation structure is isolated from the first gate structure and the second gate structure by a pair of dielectric plugs.

Example embodiment 9: The semiconductor structure of example embodiment 8, further comprising: an anode and cathode pair electrically coupled to the precision resistor directly on the gate edge isolation structure.

Example embodiment 10: The semiconductor structure of example embodiment 9, wherein a total width of the precision resistor, the pair of dielectric plugs, and the anode and cathode pair is substantially the same as a width of the gate edge isolation structure.

Example embodiment 11: The semiconductor structure of example embodiment 9, wherein a total width of the precision resistor, the pair of dielectric plugs, and the anode and cathode pair is less than a width of the gate edge isolation structure.

Example embodiment 12: A method of fabricating precision resistor, the method comprises forming a plurality of semiconductor fins protruding through a trench isolation region above a substrate. A first gate structure is formed over a first of the plurality of semiconductor fins. A second gate structure is formed over a second of the plurality of semiconductor fins. A gate edge isolation structure is formed laterally between and in contact with the first gate structure and the second gate structure, the gate edge isolation structure on the trench isolation region and extending above an uppermost surface of the first gate structure and the second gate structure. A precision resistor on the gate edge isolation structure, wherein the precision resistor and the first gate structure and second gate structure comprise a same material layer.

Example embodiment 13: The method of example embodiment 12, wherein the precision resistor comprises polysilicon.

Example embodiment 14: The method of example embodiment 12 or 13, wherein the precision resistor has a thickness of approximately 50-200 microns.

Example embodiment 15: The method of example embodiment 12, 13 or 14, wherein the precision resistor has a width of approximately 100-900 microns.

Example embodiment 16: The method of example embodiment 12, 13, 14 or 15, wherein the precision resistor is implanted with boron at 3-10 KeV or implanted with arsenic at 10-40 KeV.

Example embodiment 17: The method of example embodiment 12, 13, 14, 15 or 16, wherein the gate edge isolation structure comprises hafnium oxide, silicon nitride, and silicon oxide.

Example embodiment 18: The method of example embodiment 12, 13, 14, 15, 16 or 17, wherein the precision resistor on the gate edge isolation structure is isolated from the first gate structure and the second gate structure by a pair of dielectric plugs.

Example embodiment 19: The method of example embodiment 12, 13, 14, 15, 16, 17 or 18, further comprising: an anode and cathode pair electrically coupled to the precision resistor directly on the gate edge isolation structure.

Example embodiment 20: The method of example embodiment 19, wherein a total width of the precision resistor, the pair of dielectric plugs, and the anode and cathode pair is substantially the same as a width of the gate edge isolation structure.

Example embodiment 21: The method of example embodiment 19, wherein a total width of the precision resistor, the pair of dielectric plugs, and the anode and cathode pair is less than a width of the gate edge isolation structure.

Example embodiment 22: A method of fabricating precision resistor, the method comprises forming a trench isolation region and semiconductor fins protruding from the trench isolation region. Gate edge isolation structures are formed in the trench isolation region in non-fin regions. A dummy gate structure is formed by conformably depositing a layer of polysilicon over trench isolation region, including the semiconductor fins and the gate edge isolation structures. A hardmask is formed over the dummy gate structure. A photoresist layer is formed over the hardmask layer to define one or more resistor locations over one or more of the gate edge isolation structures, and the hardmask layer is removed to form a polysilicon precision resistor over the one or more of the gate edge structures.

Example embodiment 23: The method of example embodiment 22 further comprising: replacing the dummy gate structure with metal gate electrodes.

Example embodiment 24: The method of example embodiment 22 or 23 further comprising: implanting the precision resistor with boron at 3-10 KeV or implanted with arsenic at 10-40 KeV.

Example embodiment 25: The method of example embodiment 22, 23 or 24, further comprising: forming the gate edge structures with a top portion comprising hafnium oxide, sides and bottom portion comprising silicon nitride, and an inner portion comprising silicon oxide.

What is claimed is:

1. A semiconductor structure, comprising:
    a plurality of semiconductor fins protruding through a trench isolation region above a substrate;
    a first gate structure over a first of the plurality of semiconductor fins;
    a second gate structure over a second of the plurality of semiconductor fins; and
    a gate edge isolation structure laterally between and in contact with the first gate structure and the second gate structure, the gate edge isolation structure extending through a top surface of the trench isolation region and extending above an uppermost surface of the first gate structure and the second gate structure; and
    a precision resistor on the gate edge isolation structure above the trench isolation region in a non-fin region of the semiconductor structure.

2. The semiconductor structure of claim 1, wherein the precision resistor is uncovered except for a dielectric layer.

3. The semiconductor structure of claim 1, wherein the precision resistor comprises polysilicon.

4. The semiconductor structure of claim 1, wherein the precision resistor has a thickness of approximately 50-200 microns.

5. The semiconductor structure of claim 1, wherein the precision resistor has a width of approximately 100-900 microns.

6. The semiconductor structure of claim 1, wherein the precision resistor is implanted with boron at 3-10 KeV or implanted with arsenic at 10-40 KeV.

7. The semiconductor structure of claim 1, wherein the gate edge isolation structure comprises hafnium oxide, silicon nitride, and silicon oxide.

8. The semiconductor structure of claim 1, wherein the precision resistor on the gate edge isolation structure is isolated from the first gate structure and the second gate structure by a pair of dielectric plugs.

9. The semiconductor structure of claim 8, further comprising: an anode and cathode pair electrically coupled to the precision resistor directly on the gate edge isolation structure.

10. The semiconductor structure of claim 9, wherein a total width of the precision resistor, the pair of dielectric plugs, and the anode and cathode pair is substantially the same as a width of the gate edge isolation structure.

11. The semiconductor structure of claim 9, wherein a total width of the precision resistor, the pair of dielectric plugs, and the anode and cathode pair is less than a width of the gate edge isolation structure.

* * * * *